(12) United States Patent
Michalak

(10) Patent No.: US 8,310,225 B2
(45) Date of Patent: Nov. 13, 2012

(54) CURRENT SENSING MECHANISM

(75) Inventor: Gerald Paul Michalak, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 177 days.

(21) Appl. No.: 12/353,626

(22) Filed: Jan. 14, 2009

(65) Prior Publication Data

US 2010/0176793 A1 Jul. 15, 2010

(51) Int. Cl.
*G01R 33/07* (2006.01)
*G01R 15/18* (2006.01)

(52) U.S. Cl. ................... 324/117 H; 324/117 R

(58) Field of Classification Search .......... 324/117 R, 324/117 H, 762.01–762.03, 260–263, 126, 324/127; 257/48; 438/14–18
See application file for complete search history.

(56) References Cited

U.S. PATENT DOCUMENTS

| | | | |
|---|---|---|---|
| 4,989,460 A * | 2/1991 | Mizuno et al. ........... 73/862.335 |
| 5,570,034 A * | 10/1996 | Needham et al. ........ 324/762.02 |
| 5,963,038 A | 10/1999 | De Jong |
| 6,177,806 B1 | 1/2001 | Burghartz |
| 7,193,408 B2 * | 3/2007 | Cattaneo et al. .......... 324/117 R |
| 7,208,963 B2 | 4/2007 | Schrom et al. |
| 7,504,820 B2 | 3/2009 | Delevoye et al. |
| 7,679,162 B2 | 3/2010 | Dupuis et al. |
| 2006/0091896 A1 | 5/2006 | Schrom |
| 2007/0139066 A1 | 6/2007 | Dupuis |

FOREIGN PATENT DOCUMENTS

| DE | 10233129 | 2/2003 |
|---|---|---|
| WO | 2005064356 | 7/2005 |

OTHER PUBLICATIONS

International Search Report-PCT/US2010/021066, International Search Authority-European Patent Office Apr. 29, 2010.
Written Opinion-PCT/US2010/021066, International Search Authority-European Patent Office Apr. 29, 2010.

* cited by examiner

*Primary Examiner* — Tung X Nguyen
(74) *Attorney, Agent, or Firm* — Nicholas J. Pauley; Peter Michael Kamarchik; Jonathan T. Velasco

(57) ABSTRACT

A current sensing mechanism for use in an integrated circuit is described. In one embodiment, the integrated circuit comprises a voltage supply rail and a current sensor coupled to that voltage supply rail such that the current sensor determines the current passing through the voltage supply rail. Leads attached to the current sensor can be monitored to obtain measurements that permit determination of the current.

22 Claims, 10 Drawing Sheets

CURRENT SENSING MECHANISM

FIELD OF THE DISCLOSURE

Embodiments of the inventive concepts disclosed herein relate generally to the field of integrated circuits. More particularly, embodiments of the inventive concepts disclosed herein relate to current sensing mechanisms operating as part of an integrated circuit.

BACKGROUND

A typical integrated circuit can have numerous separate voltage supply regimes (or pads), which are further subdivided into even more voltage supply rails residing inside a single die or multi-die package. Generally, external connections to each regime—but not to individual voltage supply rails—provide physical access to each voltage regime for purposes of obtaining voltage and/or current measurements for the individual regimes. The physical access permits measurement of the voltage and current of each regime with laboratory equipment. However, physical access to each individual voltage rail within a voltage regime is generally not possible under run-time conditions since the voltage rails are encapsulated within the package with no external connections leading to the individual voltage rails themselves. As a result, it is not generally possible to measure the current and voltage of an individual voltage rail except in special circumstances.

In many integrated circuit arrangements, software controls the power consumption of the chip in an attempt to ensure that the power that needs to be consumed to accomplish a particular task is utilized in an efficient manner. As the thermal limits of a package are pushed, it is important to give the software greater capability and flexibility in regulating the power consumption of the chip, in part to ensure more efficient operation of the chip and in part because power consumption is a figure of merit in the marketplace. Where measurements associated with each voltage regime are available, the software can control the operation of the chip to minimize power consumption at a gross level. Thus, where multiple blocks, such as for example a mobile display processor, a memory controller, a graphics processor, a video accelerator, and an AXI bus, are all powered as part of a common voltage regime, a measurement of the voltage and current of that particular regime is really just a composite measurement representing the aggregate contributions from all of these blocks. With more refined measurements for each of the blocks, however, the software can provide much better and more efficient power consumption management for that particular voltage regime and hence for the chip itself.

In addition to run-time considerations, measurement of the voltage and current of voltage regimes is also useful during the software development process, which is a long-delay task. The availability of more refined voltage/current measurements beyond the composite numbers available at the voltage regime level can help in reducing this development time and thereby expedite product introduction into the market.

Possible approaches to obtain more refined measurements at the individual voltage rail level exist, but involve using external measurement equipment that is attached to the chip under consideration at multiple measurement points. In such approaches, an external meter, such as an ammeter, can be attached to the chip under consideration at external test points using multiple clips to obtain individual voltage rail Accordingly, mechanisms for sensing current and/or voltage in individual voltage rails encapsulated within a package are desirable where the mechanisms are included with the package itself.

SUMMARY OF THE DISCLOSURE

In an embodiment, a current sensing mechanism as part of an integrated circuit is described. The integrated circuit comprises a voltage supply rail and a current sensor coupled to that voltage supply rail such that the current sensor measures the current passing through the voltage supply rail.

This illustrative embodiment is mentioned not to limit or define the inventive concepts disclosed herein, but to provide examples to aid understanding thereof. Other aspects, advantages, and features of the present disclosure will become apparent after review of the entire application, including the following sections: Brief Description of the Drawings, Detailed Description, and the Claims.

BRIEF DESCRIPTION OF THE DRAWINGS

These and other features, aspects, and advantages of the present inventive concepts disclosed herein are better understood when the following Detailed Description is read with reference to the accompanying drawings, wherein.

DETAILED DESCRIPTION

Throughout the description, for the purposes of explanation, numerous specific details are set forth in order to provide a thorough understanding of the inventive concepts disclosed herein. It will be apparent, however, to one skilled in the art that the inventive concepts disclosed herein may be practiced without some of these specific details. In other instances, well-known structures and devices are shown in block diagram form to avoid obscuring the underlying principles of the inventive concepts disclosed herein.

Embodiments of the inventive concepts disclosed herein relate to current sensing mechanisms that are part of an integrated circuit. A concept utilized in embodiments is to embed current measuring circuits inside a single die or multi-die package to determine the currents on individual voltage rails. In one embodiment, a current sensing mechanism comprises a magnetically shielded coil fabricated from metal layers and vias that comprise part of the multi-layer silicon die comprising the integrated circuit. In an alternative embodiment, a current sensing mechanism comprises a Hall Effect sensor fabricated and embedded within the package. In some embodiments, the resulting signals from current sensing mechanisms can be amplified and multiplexed prior to distribution to a power management software system.

Figure 1:
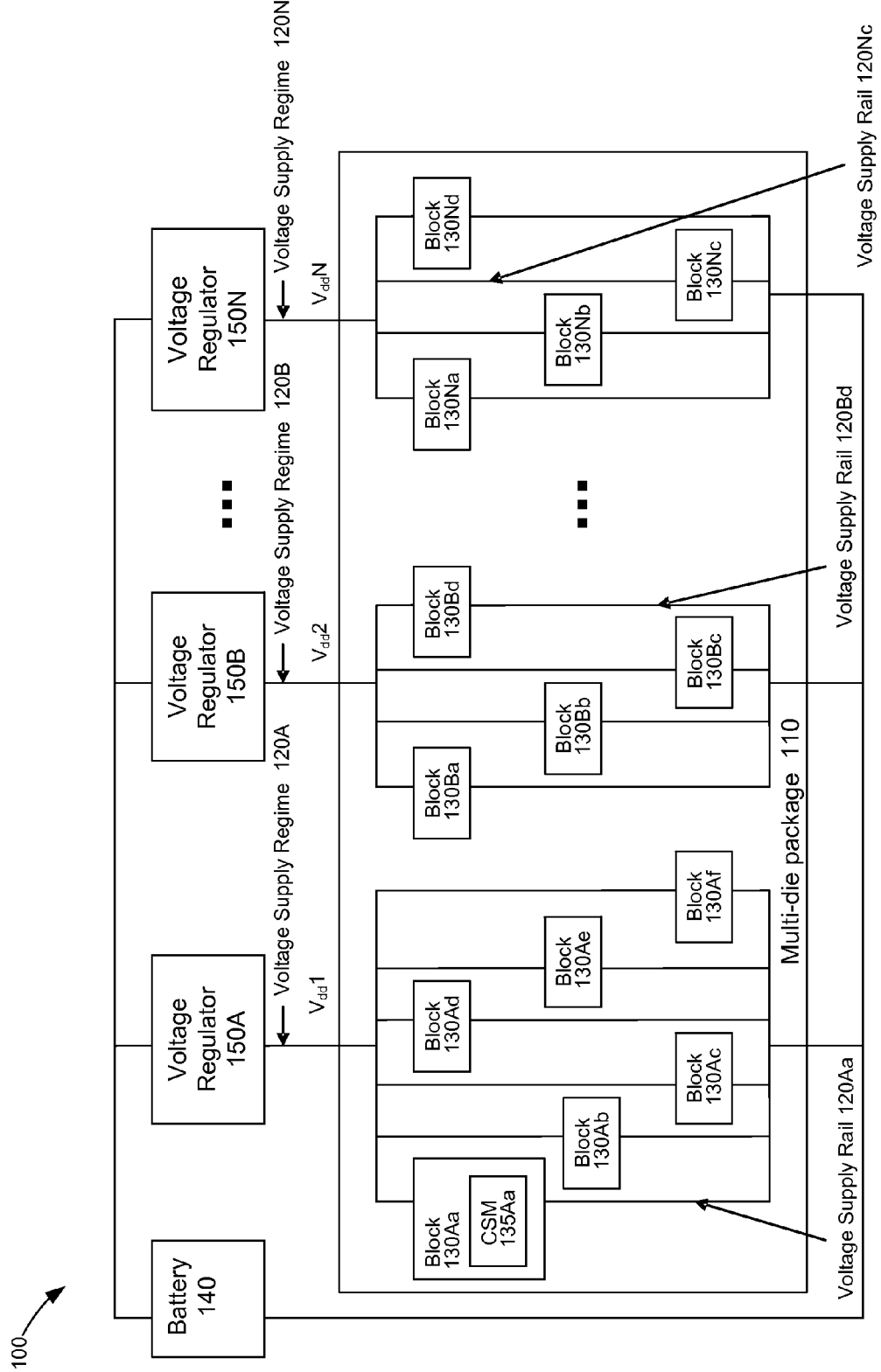
FIG. 1 is an illustration showing power distribution in an embodiment of a multi-die package.

FIG. 1 illustrates an embodiment of a power distribution architecture 100 comprising a multi-die package 110 with multiple voltage supply regimes 120A-N associated with voltage regulators 150A-N and multiple voltage supply rails 120Aa-Af, 120Ba-Bd, . . . , 120Na-Nd within each respective regime. Each voltage supply regime can have any number of voltage supply rails independent of the number of voltage supply rails in any other voltage supply regime. In other embodiments, one or more voltage supply regimes may operate in conjunction with a single die package. The voltage supply rails are connected to corresponding blocks 130Aa-Af, 130Ba-Bd, 130Na-Nd respectively. The blocks comprise any devices or circuit arrangements supplied with voltage by a voltage supply rail. Examples include, but are in no way limited to, a mobile display processor, a memory controller, a graphics processor, a video accelerator, or a bus. In this embodiment, the several voltage supply regimes are driven by a power source, such as battery 140 through individual voltage regulators 150A-N. One of ordinary skill in the art will recognize that other arrangements with multiple power sources are possible. To increase the number of available voltage and/or current measurements and thereby provide added flexibility in controlling power consumption and management on the chip, one or more current sensing mechanisms as described herein are embedded within the multi-die package 110 to obtain measurements from one or more of the voltage supply rails 120Aa-Af, 120Ba-Bd, . . . , 120Na-Nd within one or more of the voltage supply regimes 120A-N. FIG. 1 shows as an illustration a current sensing mechanism 135Aa associated with voltage supply rail 120Aa. Although FIG. 1 only illustrates a single current sensing mechanism 135Aa, multiple current sensing mechanisms can be utilized, and a current sensing mechanism can be associated with any voltage supply rail. Measurements permitting determination of the current can be obtained by monitoring leads associated with the current sensing mechanism.

Figure 2:
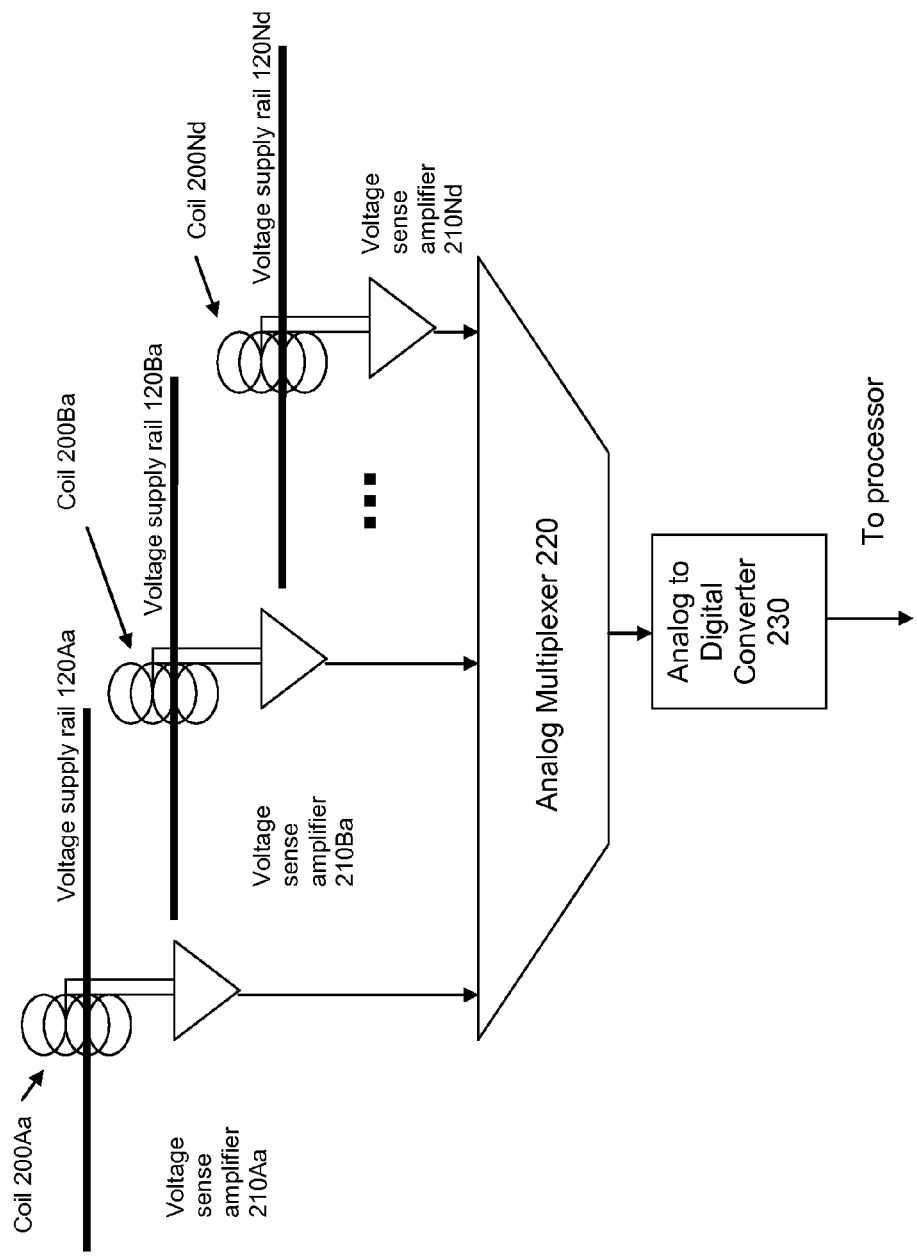
FIG. 2 is an illustration showing how measurements from multiple current sensing mechanisms can be multiplexed and sent to a processor according to an embodiment.

In some embodiments, current sensing mechanisms are used that include a pick-up coil to detect current from one or more voltage supply rails. FIG. 2 illustrates an embodiment in which measurements by current sensing mechanisms that include pick-up coils are multiplexed to a common point and sent to a processor for use by, for example, power management software. The voltage measurement from each voltage supply rail of interest 120Aa-Nd and its associated pick-up coil 200Aa-Nd, which is proportional to the current in the voltage supply rail of interest, is amplified in a corresponding voltage sense amplifier 210Aa-Nd, the outputs of which are then fed into a multiplexer 220 and then to an analog-to-digital (A/D) converter 230. As is well known to one of ordinary skill in the art, a multiplexer is a device for organizing multiple streams of data for transmission over a single communication line. In an embodiment, the output of the multiplexer is a single stream of analog measurements from multiple voltage supply rails. Similarly, it is well known to one of ordinary skill in the art that an A/D converter is a device for converting a continuously varying signal (i.e. analog) into a binary stream of data for use with a computer. In an embodiment, the A/D converter is utilized to obtain digital data representing the measurements of interest for use in software algorithms for managing power operations on the chip. In some embodiments, the outputs of voltage sensing amplifiers 300Aa-Nd are directed into corresponding A/D converters prior to multiplexing. One of ordinary skill in the art will recognize that other variations are also possible.

Figure 3:
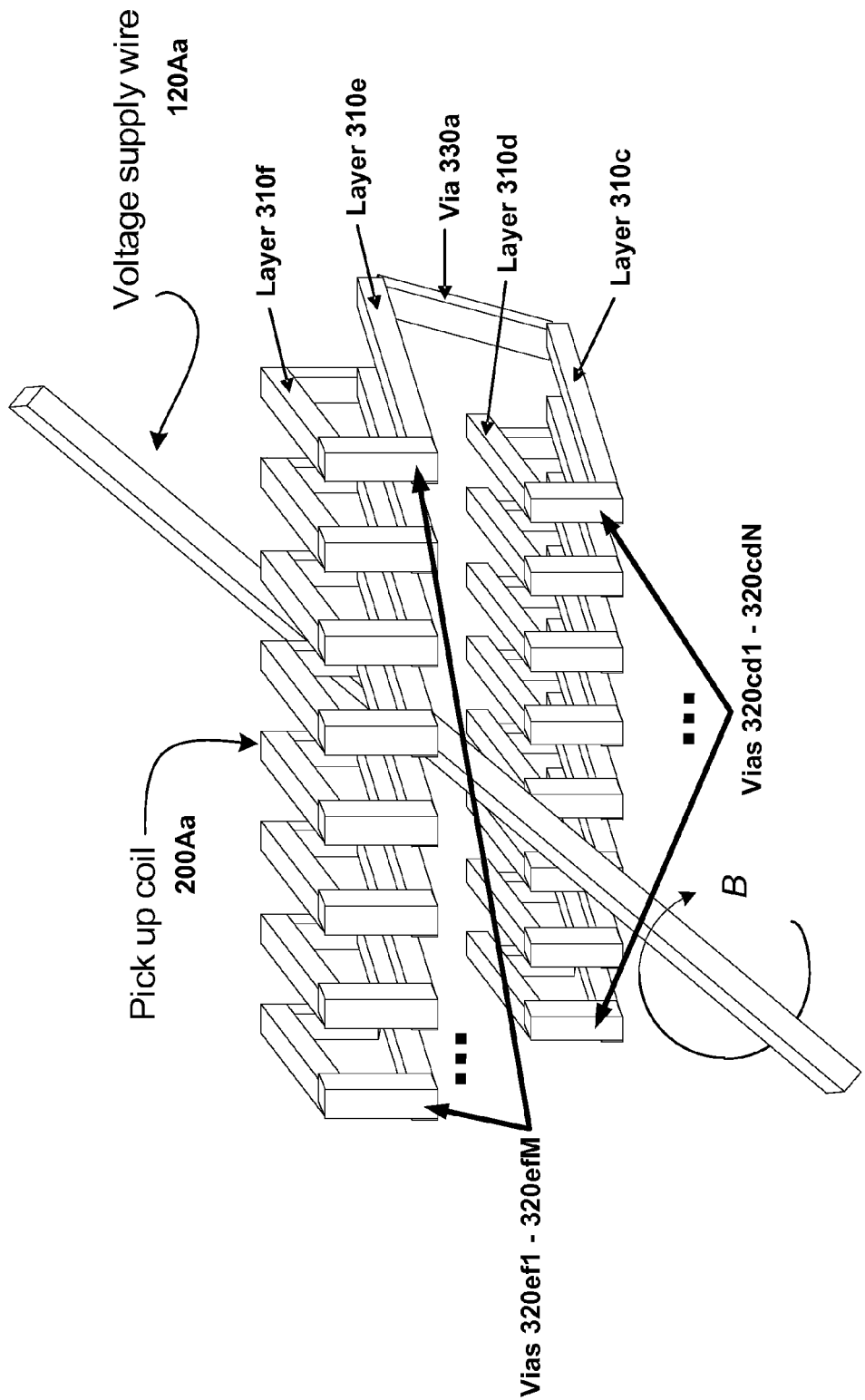
FIG. 3 is an illustration of a current sensing mechanism in which a coil is fabricated from metal layers surrounding a supply conductor according to an embodiment.

FIG. 3 illustrates one embodiment of a current sensing mechanism in the form of pick-up coil 200Aa associated with a selected voltage supply rail, e.g. voltage supply rail 120Aa. The coil can be constructed using the metal layers above and below voltage supply rails 120Aa along with metal vias to connect the coil as it winds around the voltage supply rail 120Aa. In an embodiment, voltage supply rail 120Aa passes between some subset of the metal layers 310a-n of a multi-layer chip. Commonly a chip can have six metal layers, although more or less layers are possible. As FIG. 3 shows, metal layers 310c, 310d below the voltage supply rail 120Aa and metal layers 310e, 310f above it may be joined by metal vias 320cdl-cdN and 320efl-efM respectively to form subsets of a coil, which may in turn be further connected by metal vias 330a-p as required to form a coil surrounding voltage supply rail 120Aa. The coil will generate a voltage proportional to the current in voltage supply rail 120Aa. Thus sensing this voltage permits determination of the current in voltage supply rail 120Aa. A separate coil 200Aa-Nd can be embedded around each voltage supply rail 120Aa-Nd as desired.

In an embodiment, magnetic shielding can also be achieved by using adjoining metal layers to construct a shielding cage around most of the pick-up coil and the local section of voltage supply rail 120Aa. This shielding can operate to help isolate the coil from currents flowing through other transistors on the chip as well as stray magnetic fields. It also can operate to protect other circuit elements such as transistors on the chip from damage due to the coil. In addition, an on-off switch (not shown) can be attached to the leads to each coil to give the ability to break open the coil when desired so as to control and/or eliminate any resistance drop imposed when the current induces a voltage in the coil during the measurement process.

Figure 4:
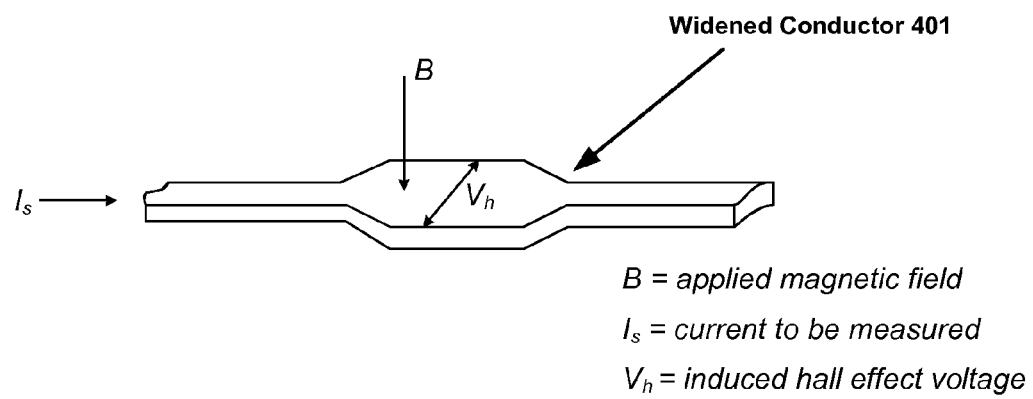
FIG. 4 illustrates the physical principle underlying the Hall Effect.
Figure 5:
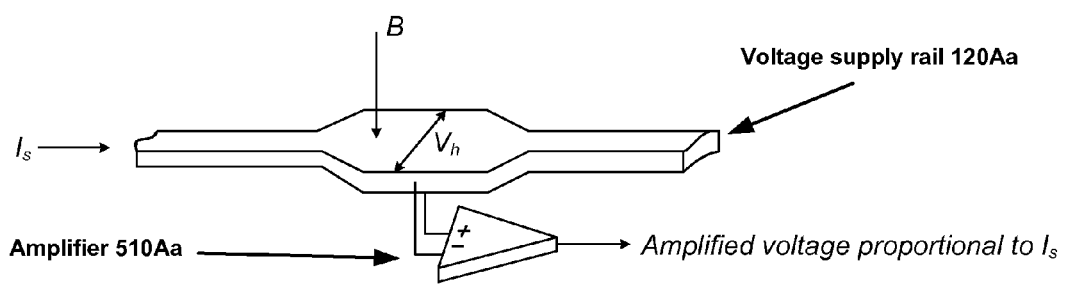
FIG. 5 is an illustration of a current sensing mechanism utilizing the Hall Effect according to an embodiment.

In a different embodiment, a current sensing mechanism comprises a Hall Effect sensor embedded in the chip to take advantage of the Hall Effect. A magnetic field exists perpendicular to the current flow; the Hall Effect sensor uses the effect of this transverse magnetic field to determine the current flowing through a voltage supply rail of interest. As FIG. 4 illustrates, a magnetic field B that is perpendicular to the current $I_s$ of interest induces a transverse Hall Effect voltage $V_h$ proportional to the current $I_s$ in the conductor. Hence, by measuring the induced transverse Hall Effect voltage $V_h$, one can determine the current $I_s$ flowing in the conductor through use of additional known physical properties of the device or through use of a calibration approach as described further below. FIG. 4 shows the conductor 401 widened to enhance the Hall Effect voltage, but this widening is for illustration purposes only; such widening is not necessary. As shown in FIG. 5, for a current flowing through a voltage supply rail of interest, e.g. voltage supply rail 120Aa, the induced Hall Effect voltage may be amplified by an associated amplifier 510Aa and thereby sensed. Because this sensed voltage is proportional to the current flowing through voltage rail 120Aa, this current can be determined from this measurement utilizing well-known relations between the induced voltage $V_h$, and the current $I_s$ of interest. For current flow on the order of milliamps and an applied magnetic field on the order of $10^{-4}$ Tesla, the induced Hall Effect voltage can be measurable after amplification.

The external magnetic field may be applied to the entire package uniformly, or it can be focused to cover only the part of the package containing Hall Effect sensors. In addition, it is possible to use the metal layers and vias of the chip to build a vertical coil in an analogous fashion to what has been described previously for the pick-up coil. Such a coil can permit generation of the appropriate magnetic field for use with the Hall Effect current sensing mechanism.

Calibration of the current sensing mechanism, whether in the form of a pick-up coil or a Hall Effect sensor, can take advantage of the tight matching tolerance of the semiconductor fabrication process. A calibration factor $k_{cal}$, which applies to all voltage supply rails, can be computed as $$I_{measured\ regime} = k_{cal} * \Sigma I_{measured\ voltage\ supply\ rail}$$

Example Devices Including The Above-Described Features

Figure 6:
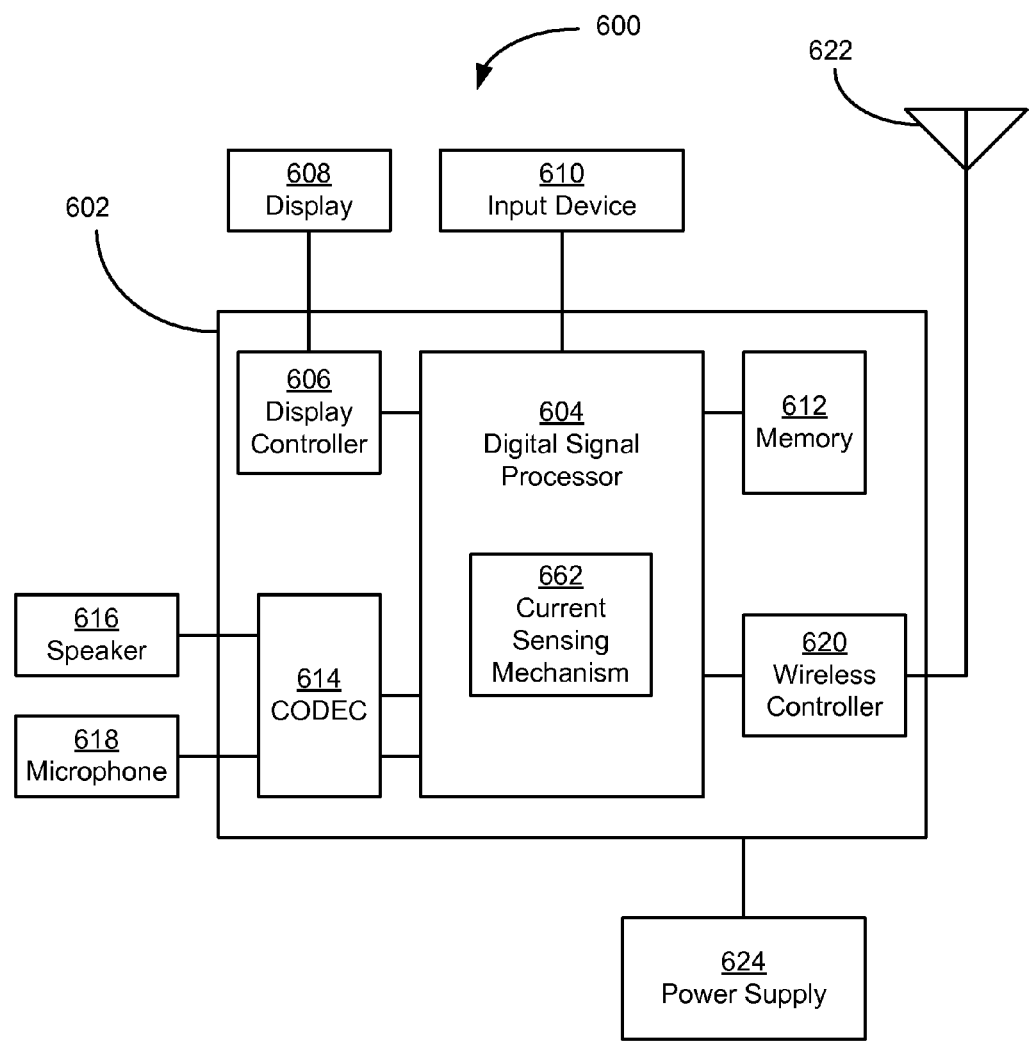
FIG. 6 is a diagram illustrating an example portable communication device that may include a current sensing mechanism that can provide measurement of voltage and/or currents on an individual voltage supply rail within a package.

FIG. 6 is a diagram illustrating an exemplary embodiment of a portable communication device 600. As illustrated in the general diagram of FIG. 6, the portable communication device includes an on-chip system 602 that includes a digital signal processor (DSP) 604. The general diagram of FIG. 6 also shows a display controller 606 that is coupled to the digital signal processor (DSP) 604 and a display 608. Moreover, an input device 610 is coupled to the DSP 604. As shown, a memory 612 is coupled to the DSP 604. Additionally, a coder/decoder (CODEC) 614 may be coupled to the DSP 604. A speaker 616 and a microphone 618 may be coupled to the CODEC 614.

The general diagram of FIG. 6 further illustrates a wireless controller 620 coupled to the digital signal processor 604 and a wireless antenna 622. In a particular embodiment, a power supply 624 is coupled to the on-chip system 602. The display 626, the input device 630, the speaker 616, the microphone 618, the wireless antenna 622, and the power supply 624 may be external to the on-chip system 602. However, each can be coupled to a component of the on-chip system 602.

In a particular embodiment, DSP 604 includes a current sensing mechanism 662, such as is described with reference to FIGS. 1-5, that can provide measurement of voltage and/or currents on an individual voltage supply rail within a package.

Figure 7:
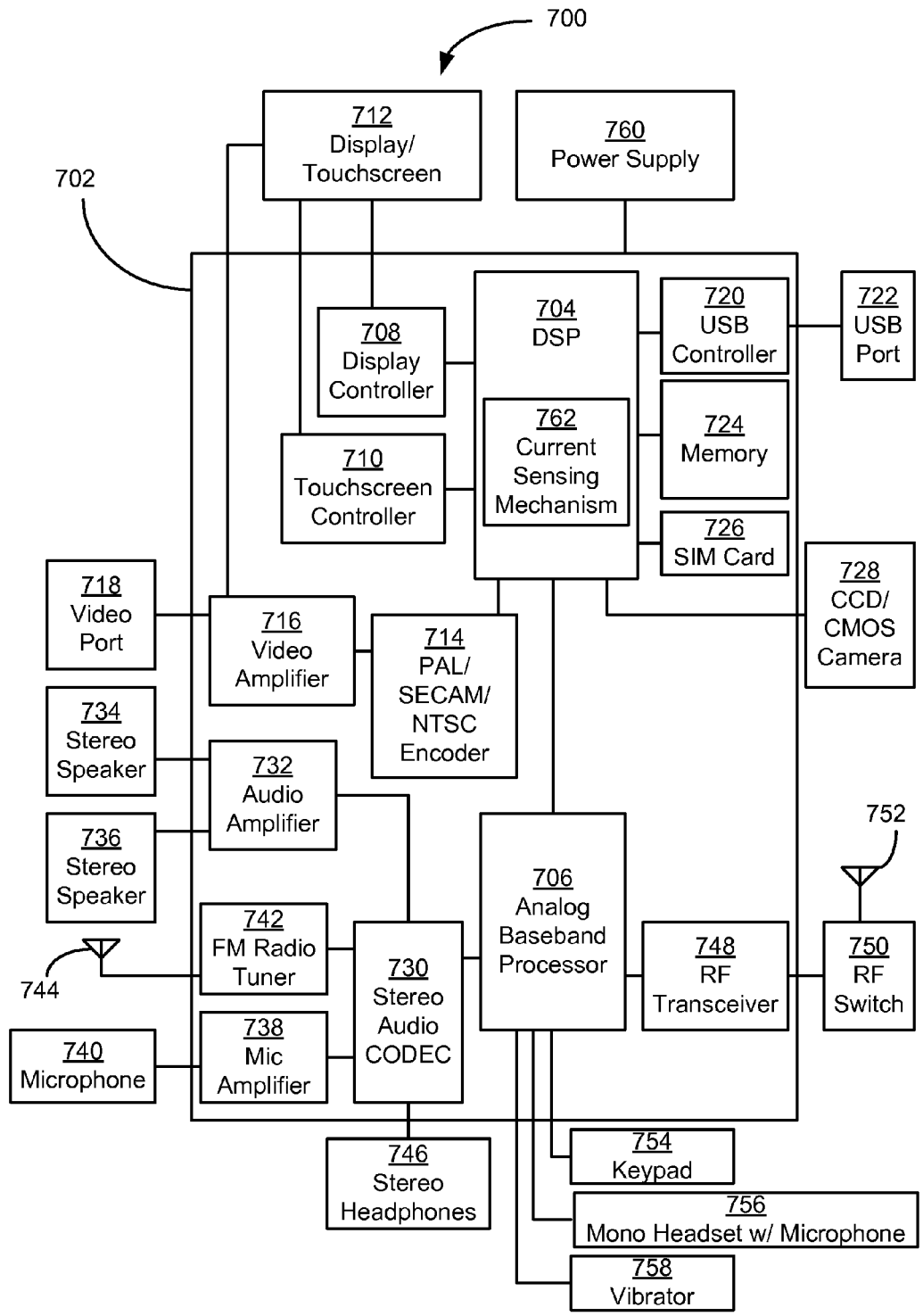
FIG. 7 is a diagram illustrating an example cellular telephone that may include a current sensing mechanism that can provide measurement of voltage and/or currents on an individual voltage supply rail within a package.

FIG. 7 is a diagram illustrating an exemplary embodiment of a cellular telephone 700. As shown, the cellular telephone 700 includes an on-chip system 702 that includes a digital baseband processor 704 and an analog baseband processor 706 that are coupled together. In a particular embodiment, the digital baseband processor 704 is a digital signal processor. As illustrated in the general diagram of FIG. 7, a display controller 708 and a touchscreen controller 710 are coupled to the digital baseband processor 704. In turn, a touchscreen display 712 external to the on-chip system 702 is coupled to the display controller 708 and the touchscreen controller 710.

The general diagram of FIG. 7 further illustrates a video encoder 714, e.g., a phase alternating line (PAL) encoder, a sequential couleur a memoire (SECAM) encoder, or a national television system(s) committee (NTSC) encoder, is coupled to the digital baseband processor 704. Further, a video amplifier 716 is coupled to the video encoder 714 and the touchscreen display 712. Also, a video port 718 is coupled to the video amplifier 716. A universal serial bus (USB) controller 720 is coupled to the digital baseband processor 704. Also, a USB port 722 is coupled to the USB controller 720. A memory 724 and a subscriber identity module (SIM) card 726 may also be coupled to the digital baseband processor 704. Further, as shown in the general diagram of FIG. 12, a digital camera 728 may be coupled to the digital baseband processor 704. In an exemplary embodiment, the digital camera 728 is a charge-coupled device (CCD) camera or a complementary metal-oxide semiconductor (CMOS) camera.

As further illustrated in the general diagram of FIG. 7, a stereo audio CODEC 730 may be coupled to the analog baseband processor 706. Moreover, an audio amplifier 732 may be coupled to the stereo audio CODEC 730. In an exemplary embodiment, a first stereo speaker 734 and a second stereo speaker 736 are coupled to the audio amplifier 732. A microphone amplifier 738 may be also coupled to the stereo audio CODEC 730. Additionally, a microphone 740 may be coupled to the microphone amplifier 738. In a particular embodiment, a frequency modulation (FM) radio tuner 742 may be coupled to the stereo audio CODEC 730. An FM antenna 744 can be coupled to the FM radio tuner 742. Further, stereo headphones 746 may be coupled to the stereo audio CODEC 730.

The general diagram of FIG. 7 further illustrates a radio frequency (RF) transceiver 748 that may be coupled to the analog baseband processor 706. An RF switch 750 may be coupled to the RF transceiver 748 and an RF antenna 752. A keypad 754 may be coupled to the analog baseband processor 706. Also, a mono headset with a microphone 756 may be coupled to the analog baseband processor 706. Further, a vibrator device 758 may be coupled to the analog baseband processor 706. The general diagram of FIG. 7 also shows a power supply 760 that may be coupled to the on-chip system 702. In a particular embodiment, the power supply 760 is a direct current (DC) power supply that provides power to the various components of the cellular telephone 700. Further, in a particular embodiment, the power supply is a rechargeable DC battery or a DC power supply that is derived from an alternating current (AC) to DC transformer that is coupled to an AC power source.

As depicted in the general diagram of FIG. 7, the touchscreen display 712, the video port 718, the USB port 722, the camera 728, the first stereo speaker 734, the second stereo speaker 736, the microphone 740, the FM antenna 744, the stereo headphones 746, the RF switch 750, the RF antenna 752, the keypad 754, the mono headset 756, the vibrator 758, and the power supply 760 may be external to the on-chip system 702.

In a particular embodiment, DSP 704 includes a current sensing mechanism 762, such as is described with reference to FIGS. 1-5, that can provide measurement of voltage and/or currents on an individual voltage supply rail within a package.

Figure 8:
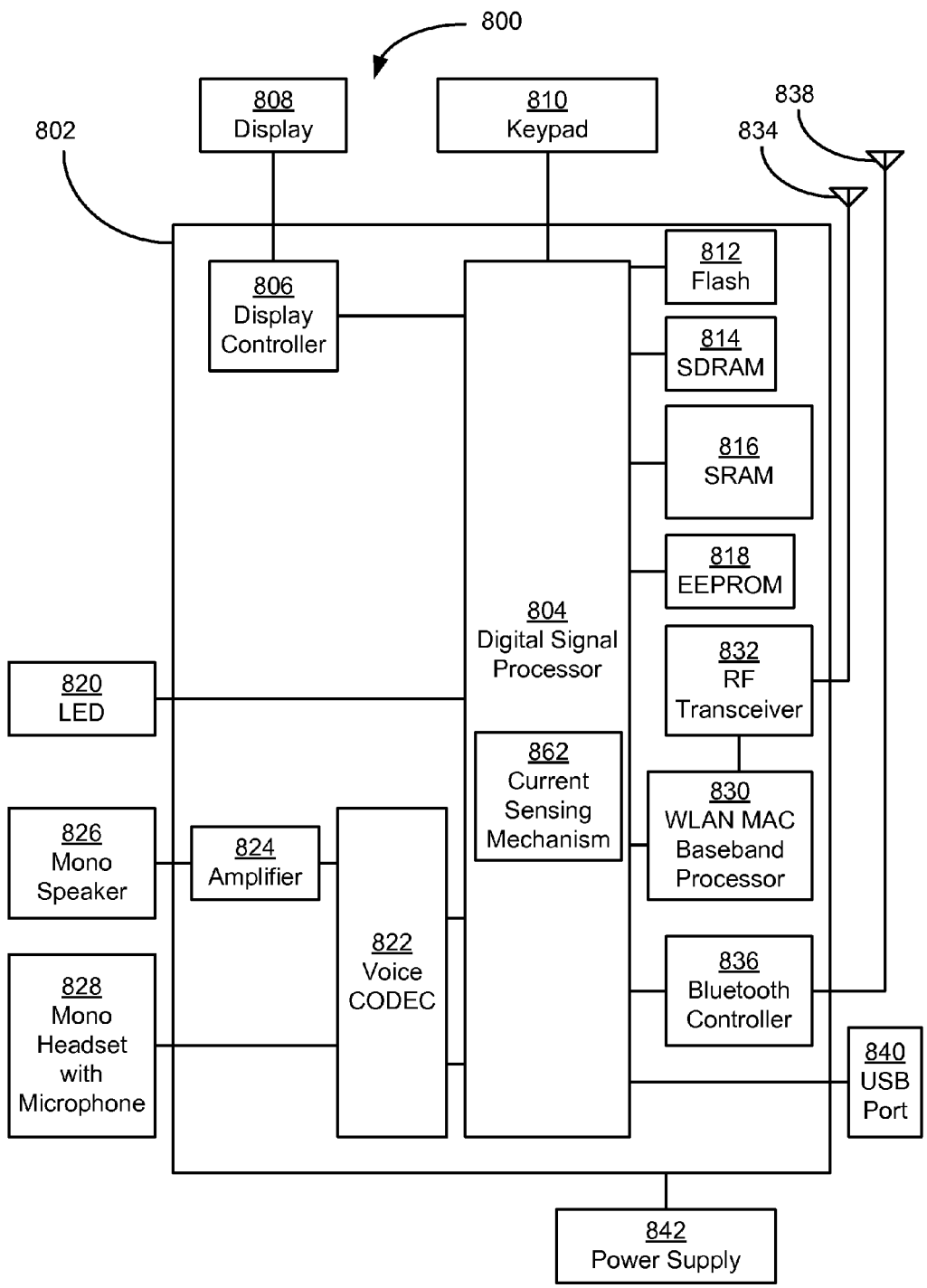
FIG. 8 is a diagram illustrating an example wireless Internet Protocol telephone that may include a current sensing mechanism that can provide measurement of voltage and/or currents on an individual voltage supply rail within a package.

FIG. 8 is a diagram illustrating an exemplary embodiment of a wireless Internet protocol (IP) telephone 800. As shown, the wireless IP telephone 800 includes an on-chip system 802 that includes a digital signal processor (DSP) 804. A display controller 806 may be coupled to the DSP 804 and a display 808 is coupled to the display controller 806. In an exemplary embodiment, the display 808 is a liquid crystal display (LCD). FIG. 8 further shows that a keypad 810 may be coupled to the DSP 804.

A flash memory 812 may be coupled to the DSP 804. A synchronous dynamic random access memory (SDRAM) 814, a static random access memory (SRAM) 816, and an electrically erasable programmable read only memory (EEPROM) 818 may also be coupled to the DSP 804. The general diagram of FIG. 8 also shows that a light emitting diode (LED) 820 may be coupled to the DSP 804. Additionally, in a particular embodiment, a voice CODEC 822 may be coupled to the DSP 804. An amplifier 824 may be coupled to the voice CODEC 822 and a mono speaker 826 may be coupled to the amplifier 824. The general diagram of FIG. 13 further illustrates a mono headset 828 coupled to the voice CODEC 822. In a particular embodiment, the mono headset 828 includes a microphone.

A wireless local area network (WLAN) baseband processor 830 may be coupled to the DSP 804. An RF transceiver 832 may be coupled to the WLAN baseband processor 830 and an RF antenna 834 may be coupled to the RF transceiver 832. In a particular embodiment, a Bluetooth controller 836 may also be coupled to the DSP 804 and a Bluetooth antenna 838 may be coupled to the controller 836. The general diagram of FIG. 13 also shows that a USB port 840 may also be coupled to the DSP 804. Moreover, a power supply 842 is coupled to the on-chip system 802 and provides power to the various components of the wireless IP telephone 800.

As indicated in the general diagram of FIG. 8, the display 808, the keypad 810, the LED 820, the mono speaker 826, the mono headset 828, the RF antenna 834, the Bluetooth antenna 838, the USB port 840, and the power supply 842 may be external to the on-chip system 802 and coupled to one or more components of the on-chip system 802.

In a particular embodiment, DSP 804 includes a current sensing mechanism 862, such as is described with reference to FIGS. 1-5, that can provide measurement of voltage and/or currents on an individual voltage supply rail within a package.

Figure 9:
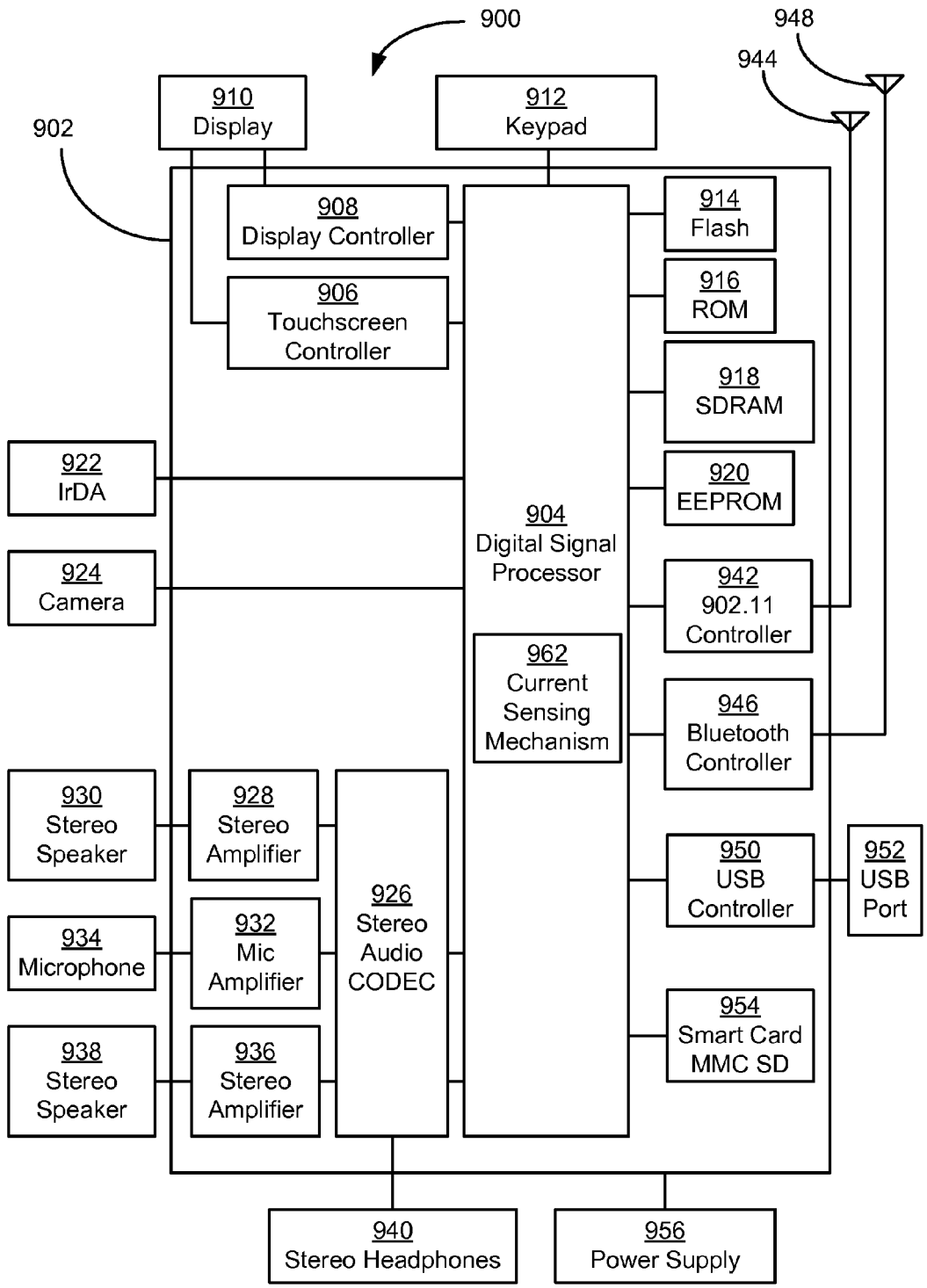
FIG. 9 is a diagram illustrating an example portable digital assistant that may include a current sensing mechanism that can provide measurement of voltage and/or currents on an individual voltage supply rail within a package.

FIG. 9 is a diagram illustrating an exemplary embodiment of a portable digital assistant (PDA) 900. As shown, the PDA 900 includes an on-chip system 902 that includes a digital signal processor (DSP) 904. A touchscreen controller 906 and a display controller 908 are coupled to the DSP 904. Further, a touchscreen display 910 is coupled to the touchscreen controller 906 and to the display controller 908. The general diagram of FIG. 9 also indicates that a keypad 912 may be coupled to the DSP 904.

In a particular embodiment, a stereo audio CODEC 926 may be coupled to the DSP 904. A first stereo amplifier 928 may be coupled to the stereo audio CODEC 926 and a first stereo speaker 930 may be coupled to the first stereo amplifier 928. Additionally, a microphone amplifier 932 may be coupled to the stereo audio CODEC 926 and a microphone 934 may be coupled to the microphone amplifier 932. The general diagram of FIG. 9 further shows a second stereo amplifier 936 that may be coupled to the stereo audio CODEC 926 and a second stereo speaker 938 that may be coupled to the second stereo amplifier 936. In a particular embodiment, stereo headphones 940 may also be coupled to the stereo audio CODEC 926.

The general diagram of FIG. 9 also illustrates an 802.11 controller 942 that may be coupled to the DSP 904 and an 802.11 antenna 944 that may be coupled to the 802.11 controller 942. Moreover, a Bluetooth controller 946 may be coupled to the DSP 904 and a Bluetooth antenna 948 may be coupled to the Bluetooth controller 946. A USB controller 950 may be coupled to the DSP 904 and a USB port 952 may be coupled to the USB controller 950. Additionally, a smart card 954, e.g., a multimedia card (MMC) or a secure digital card (SD), may be coupled to the DSP 904. Further, a power supply 956 may be coupled to the on-chip system 902 and may provide power to the various components of the PDA 900.

As indicated in the general diagram of FIG. 9, the display 910, the keypad 912, the IrDA port 922, the digital camera 924, the first stereo speaker 930, the microphone 934, the second stereo speaker 938, the stereo headphones 940, the 802.11 antenna 944, the Bluetooth antenna 948, the USB port 952, and the power supply 956 may be external to the on-chip system 902 and coupled to one or more components on the on-chip system 902.

In a particular embodiment, DSP 904 includes a current sensing mechanism 962, such as is described with reference to FIGS. 1-5, that can provide measurement of voltage and/or currents on an individual voltage supply rail within a package.

Figure 10:
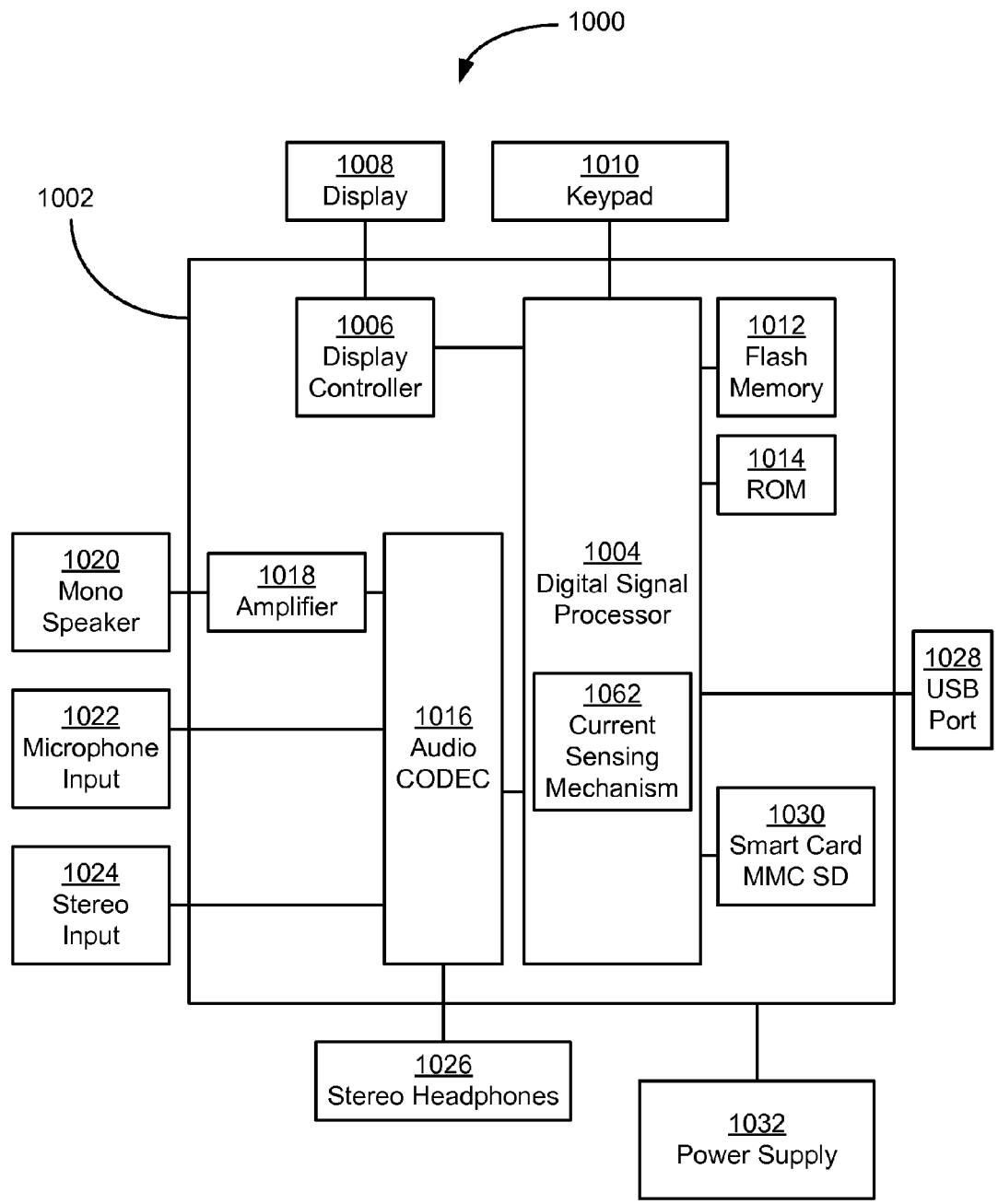
FIG. 10 is a diagram illustrating an example audio file player that may include a current sensing mechanism that can provide measurement of voltage and/or currents on an individual voltage supply rail within a package.

FIG. 10 is a diagram illustrating an exemplary embodiment of an audio file player (e.g., MP3 player) 1000. As shown, the audio file player 1000 includes an on-chip system 1002 that includes a digital signal processor (DSP) 1004. A display controller 1006 may be coupled to the DSP 1004 and a display 1008 is coupled to the display controller 1006. In an exemplary embodiment, the display 1008 is a liquid crystal display (LCD). A keypad 1010 may be coupled to the DSP 1004.

As further depicted in the general diagram of FIG. 10, a flash memory 1012 and a read only memory (ROM) 1014 may be coupled to the DSP 1004. Additionally, in a particular embodiment, an audio CODEC 1016 may be coupled to the DSP 1004. An amplifier 1018 may be coupled to the audio CODEC 1016 and a mono speaker 1020 may be coupled to the amplifier 1018. The general diagram of FIG. 10 further indicates that a microphone input 1022 and a stereo input 1024 may also be coupled to the audio CODEC 1016. In a particular embodiment, stereo headphones 1026 may also be coupled to the audio CODEC 1016.

A USB port 1028 and a smart card 1030 may be coupled to the DSP 1004. Additionally, a power supply 1032 may be coupled to the on-chip system 1002 and may provide power to the various components of the audio file player 1000.

As indicated in the general diagram of FIG. 10 the display 1008, the keypad 1010, the mono speaker 1020, the microphone input 1022, the stereo input 1024, the stereo headphones 1026, the USB port 1028, and the power supply 1032 are external to the on-chip system 1002 and coupled to one or more components on the on-chip system 1002.

In a particular embodiment, DSP 1004 includes a current sensing mechanism 1062, such as is described with reference to FIGS. 1-5, that can provide measurement of voltage and/or currents on an individual voltage supply rail within a package.

General

The foregoing description of the embodiments of the inventive concepts disclosed herein has been presented only for the purpose of illustration and description and is not intended to be exhaustive or to limit the inventive concepts disclosed herein to the precise forms disclosed. Numerous modifications and adaptations are apparent to those skilled in the art without departing from the spirit and scope of the inventive concepts disclosed herein.

What is claimed is:
1. An integrated circuit, comprising:
a voltage supply rail;
a current sensor magnetically coupled to the voltage supply rail with a coil having a first set of loops winding around a first magnetic coupling axis that extends above and crosses over the voltage supply rail in a direction perpendicular to the voltage supply rail, and a second set of loops winding around a second magnetic coupling axis that extends below and crosses under the voltage supply rail in a direction parallel to the first magnetic coupling axis, wherein the current sensor is configured to determine the current passing through the voltage supply rail.

2. The integrated circuit of claim 1, wherein the voltage supply rail further comprises voltage measurement leads.

3. The integrated circuit of claim 1, further comprising an amplifier coupled to the current sensor, and configured to amplify a voltage representing the determined current.

4. The integrated circuit of claim 1, further comprising:
a magnetic field source configured to produce a magnetic field perpendicular to the voltage rail; and
a Hall Effect sensor coupled to the coil, and configured to measure an effect of current flow through the voltage supply rails on the magnetic field.

5. The integrated circuit of claim 4, wherein the magnetic field source comprises a second coil oriented to provide the magnetic field to induce a Hall Effect voltage in the Hall Effect sensor.

6. The integrated circuit of claim 5, wherein the first set of loops comprises portions of a first upper metal layer above the voltage supply rail, portions of a second upper metal layer above the first upper metal layer, and a plurality of upper vias, each upper via extending from one of the portions of the first upper metal layer to a corresponding one of the portions of the second upper metal layer.

7. The integrated circuit of claim 6, wherein the second set of loops comprises portions of a first lower metal layer below the voltage supply rail, portions of a second lower metal layer below the first lower metal layer, and a plurality of lower vias, each lower via extending from one of the portions of the first lower metal layer to a corresponding one of the portions of the second lower metal layer, and
wherein the coil further comprises a connection via extending from one of the portions of the first upper metal layer to one of the portions of the first lower metal layer.

8. The integrated circuit of claim 1, wherein the integrated circuit is integrated with at least one of a portable communication device, a cellular telephone, a wireless internet protocol phone, a personal data assistance, and an audio file player.

9. The integrated circuit of claim 1, further comprising a shielding cage arranged to magnetically shield a part of the coil.

10. The integrated circuit of claim 1, further comprising a switch coupled to the coil and configured to stop current flow in the coil.

11. The integrated circuit of claim 1, wherein the first set of loops comprises portions of a first upper metal layer above the voltage supply rail, portions of a second upper metal layer above the first upper metal layer, and a plurality of upper vias, each upper via extending from one of the portions of the first upper metal layer to a corresponding one of the portions of the second upper metal layer.

12. The integrated circuit of claim 11, wherein the second set of loops comprises portions of a first lower metal layer below the voltage supply rail, portions of a second lower metal layer below the first lower metal layer, and a plurality of lower vias, each lower via extending from one of the portions of the first lower metal layer to a corresponding one of the portions of the second lower metal layer, and
wherein the coil further comprises a connection via extending from one of the portions of the first upper metal layer to one of the portions of the first lower metal layer.

13. The integrated circuit of claim 1, wherein the first set of loops of comprises:
a plurality of first upper metal conductors in a first upper metal layer above the voltage rail, extending parallel to the extending path of the voltage rail, and spaced apart from each other in a direction parallel to the first magnetic detection axis;
a plurality of second upper metal conductors in a second upper metal layer above the first upper metal layer, extending parallel to the extending path of the voltage rail, and spaced apart from each other in a direction parallel to the first magnetic detection axis;
a plurality of upper vias, each of the upper vias extending from one first upper metal conductor to one second upper metal conductor.

14. The integrated circuit of claim 13, wherein the second set of loops of comprises:
a plurality of first lower metal conductors in a first lower metal layer below the voltage rail, extending parallel to the extending path of the voltage rail and spaced apart from each other in a direction parallel to the second magnetic detection axis;
a plurality of second lower metal conductors in a second lower metal layer below the first lower metal layer, extending parallel to the extending path of the voltage rail and spaced apart from each other in a direction parallel to the second magnetic detection axis;
a plurality of lower vias, each of the lower vias extending from one first lower metal conductor to one second lower metal conductor, and
wherein the coil further comprises an interconnect via connecting one of the first upper metal conductors to one of the first lower metal conductors.

15. The integrated circuit of claim 14, wherein the first set of loops forms a first portion of the coil that crosses over the voltage supply rail, and not under the voltage supply rail, the second set of loops forms a second portion of the coil that crosses under the voltage supply rail, and not over the voltage supply rail, and one end of the first portion of the coil is connected to one end of the second portion of the coil by a connecting via.

16. The integrated circuit of claim 14, wherein the first set of loops forms a first portion of the coil that crosses over the voltage supply rail, and not under the voltage supply rail, the second set of loops forms a second portion of the coil that crosses under the voltage supply rail, and not over the voltage supply rail, and one end of the first portion of the coil is connected to one end of the second portion of the coil by a connecting via.

17. The integrated circuit of claim 14, wherein the first set of loops forms a first portion of the coil that crosses over the voltage supply rail, and not under the voltage supply rail, the second set of loops forms a second portion of the coil that crosses under the voltage supply rail, and not over the voltage supply rail, and one end of the first portion of the coil is connected to one end of the second portion of the coil by a connecting via.

18. A method for measuring current flow in a voltage supply rail in integrated circuit, wherein a current sensor coupled to the voltage supply rail and has a first set loops winding around a first magnetic coupling axis that is above and crosses over the voltage supply rail in a direction perpendicular to the voltage supply rail, and a second set of loops winding around a second magnetic coupling axis that is below and crosses under the voltage supply rail in a direction parallel to the first magnetic coupling axis, comprising:
detecting a portion of a circular magnetic field around the voltage supply rail that passes through the first set of loops aligned with the first magnetic coupling axis and a portion of the circular magnetic field that passes through the second set of loops aligned with the second magnetic coupling axis to determine the current passing through the voltage supply rail.

19. The method of claim 18, wherein an amplifier is coupled to the coil, further comprising amplifying a voltage representing the determined current.

20. The method of claim 19, wherein a magnetic field source is configured to produce a magnetic field perpendicular to the voltage supply rail, and a Hall effect sensor is coupled to the coil, further comprising:

producing magnetic field with the magnetic field source; and measuring an effect of current flow through the voltage supply rail on the magnetic field with the Hall effect sensor.

21. The method of claim 20, wherein the magnetic field source comprises a second coil oriented to provide the magnetic field to induce a Hall Effect voltage in the Hall Effect sensor, further comprising:

producing the magnetic field with the second coil.

22. The method of claim 18, wherein a switch is coupled to the coil and configured to stop current flow in the coil, further comprising:

operating the switch to control current flow in the coil.

* * * * *